United States Patent
Kim et al.

(10) Patent No.: US 7,408,120 B2
(45) Date of Patent: Aug. 5, 2008

(54) PRINTED CIRCUIT BOARD HAVING AXIALLY PARALLEL VIA HOLES

(75) Inventors: Young Woo Kim, Chungcheongnam-do (KR); Byoung Youl Min, Seoul (KR); Chang Myung Ryu, Kyunggi-do (KR); Han Kim, Daejeon (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 255 days.

(21) Appl. No.: 11/042,360

(22) Filed: Jan. 24, 2005

(65) Prior Publication Data
US 2005/0178585 A1 Aug. 18, 2005

(30) Foreign Application Priority Data
Feb. 13, 2004 (KR) .................. 10-2004-0009666

(51) Int. Cl.
*H01R 12/04* (2006.01)
(52) U.S. Cl. .................. 174/262; 174/260; 174/261; 174/263; 174/264; 174/265; 174/266; 361/792; 361/794; 361/795
(58) Field of Classification Search .............. 174/260, 174/262
See application file for complete search history.

(56) References Cited

U.S. PATENT DOCUMENTS

| | | | | |
|---|---|---|---|---|
| 5,140,110 A | * | 8/1992 | Nakagawa et al. | 174/250 |
| 5,374,788 A | * | 12/1994 | Endoh et al. | 174/266 |
| 5,623,160 A | * | 4/1997 | Liberkowski | 257/621 |
| 5,949,030 A | * | 9/1999 | Fasano et al. | 174/262 |
| 6,479,764 B1 | * | 11/2002 | Frana et al. | 174/262 |
| 6,486,414 B2 | * | 11/2002 | Kobayashi et al. | 174/261 |
| 7,154,047 B2 | * | 12/2006 | Howard | 174/260 |
| 2002/0179332 A1 | * | 12/2002 | Uematsu et al. | 174/262 |
| 2003/0102124 A1 | * | 6/2003 | Vinegar et al. | 166/256 |
| 2005/0247482 A1 | * | 11/2005 | Nakamura | 174/262 |

FOREIGN PATENT DOCUMENTS

JP 2001-244635 A 9/2001
JP 2002-353588 12/2002

* cited by examiner

*Primary Examiner*—Tuan Dinh
*Assistant Examiner*—Hoa C Nguyen
(74) *Attorney, Agent, or Firm*—Darby & Darby P.C.

(57) ABSTRACT

Disclosed is a PCB having axially parallel via holes, in which an outer ground via hole, acting as a ground, is formed around a via hole for intercircuit connection in the PCB, thereby minimizing the effect of noise caused by the via hole.

7 Claims, 6 Drawing Sheets

PRINTED CIRCUIT BOARD HAVING AXIALLY PARALLEL VIA HOLES

INCORPORATION BY REFERENCE

The present application claims priority under 35 U.S.C. §119 to Korean Patent Application No. 2004-9666 filed on Feb. 13, 2004. The content of the application is incorporated herein by reference in its entirety.

BACKGROUND OF THE INVENTION

1. Field of the Invention

The present invention relates to a printed circuit board (PCB) having axially parallel via holes. More particularly, the present invention pertains to a PCB having axially parallel via holes, in which an outer ground via hole, acting as a ground, is formed around a via hole for intercircuit connection in the PCB, thereby minimizing the effect of noise caused by the via hole.

2. Description of the Prior Art

In accordance with the recent miniaturization and multi-functionalization of portable information devices, such as notebook computers, PDAs, and mobile phones, demand for highly integrated PCBs used in the portable information devices is growing. Accordingly, high integration of via holes is required for circuit connection between layers of the PCB.

FIG. 1 is a sectional view of a PCB, through which various types of via holes 11, 12, 13, 14 are formed.

As shown in FIG. 1, the via holes, which are formed through the PCB, are divided into inner via holes 11 for connecting circuits of internal layers, staggered via holes 12, which have a step-shaped circuit connection path, stacked via holes 13, in which a plurality of via holes are laminated, and through via holes 14 for interlayer connection according to the purpose and shape.

The via holes of the PCB cause noise, such as transfer noise or reflection noise, due to impedance mismatching of a circuit pattern or a device therewith.

The noise caused by the via holes matters little for a low-speed signal, but significantly affects an output signal when a bandwidth is expanded and a signal processing speed increases due to a rapid increase in data transmission.

Hence, a method of processing a via hole using a laser drill, and a method of designing a through via hole and a staggered or stacked via hole have been studied in order to reduce noise caused by the via holes of the PCB.

However, the method of processing the via hole using the laser drill is problematic in that it is difficult to process the via hole when the PCB is thick, like a multilayered PCB, even though integration is improved and noise is reduced a little.

Meanwhile, in the method of designing the staggered or stacked via hole as well as the through via hole, it is possible to reduce a thickness of the PCB, which is processed by the laser drill. However, this method is problematic in that the inductance of a copper layer, acting as a conductor for the via hole, increases with an increase in a frequency, and that noise is significantly increased due to the effect of capacitance.

Turning to FIG. 1, a via hole structure of a conventional PCB is problematic in that since a power supply layer or a signal transfer layer 20 is exposed to transfer noise caused by the via hole, the power or the signal transfer is distorted.

SUMMARY OF THE INVENTION

Therefore, the present invention has been made keeping in mind the above disadvantages occurring in the prior arts, and an object of the present invention is to provide a PCB, which minimizes the effect of noise caused by a via hole due to a high frequency signal thereof.

Another object of the present invention is to provide a PCB having axially parallel via holes, in which an outer ground via hole, acting as a ground, is formed around a via hole in the PCB, thereby minimizing the effect of noise caused by the via hole.

The above objects can be accomplished by providing a PCB having axially parallel via holes. The PCB comprises a plurality of circuit layers, on which circuit patterns are formed. A plurality of insulating layers is interposed between the plurality of circuit layers. A plurality of via holes has a continuous curvilinear section, extends perpendicular to a surface of any one of the plurality of circuit layers, and is plated with a first conductive material on walls thereof. An outer ground via hole surrounds at least one via hole of the plurality of via holes, extends so as to be axially parallel to the via hole surrounded thereby and to be a predetermined distance away from a wall of the via hole, and is plated with a second conductive material on the wall thereof. An insulating material is packed between the via hole, which is surrounded by the outer ground via hole, and the outer ground via hole.

It is preferable that the via hole, which is surrounded by the outer ground via hole, be selected from the group consisting of an inner via hole for connection between internal layers, a staggered via hole having a step-shaped circuit connection path, a stacked via hole, which is formed by laminating the plurality of via holes, a through via hole for connection between external layers, and a blind via hole for connection between the circuit layers.

It is preferable that the outer ground via hole be grounded.

It is preferable that the second conductive material of the outer ground via hole be a copper plating layer.

It is preferable that the via hole, which is surrounded by the outer ground via hole, be coaxial to the outer ground via hole.

It is preferable that the via hole, which is surrounded by the outer ground via hole, be axially parallel to the outer ground via hole.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Hereinafter, a detailed description will be given of a PCB having axially parallel via holes according to the present invention, with reference to the drawings.

Figure 1:
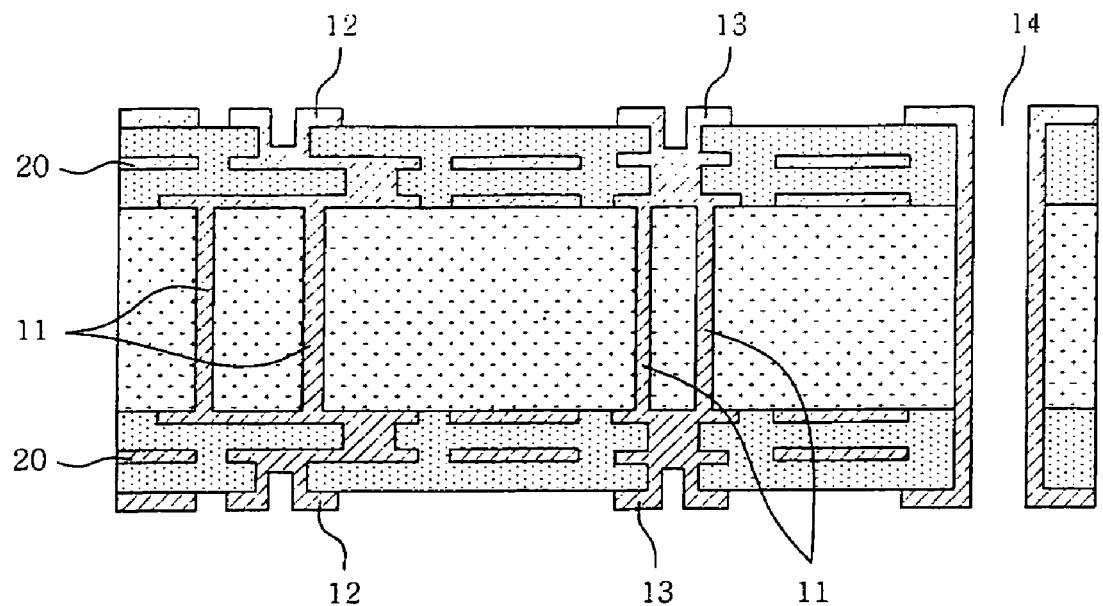
FIG. 1 is a sectional view of a PCB, through which various types of via holes are formed.
Figure 2A:
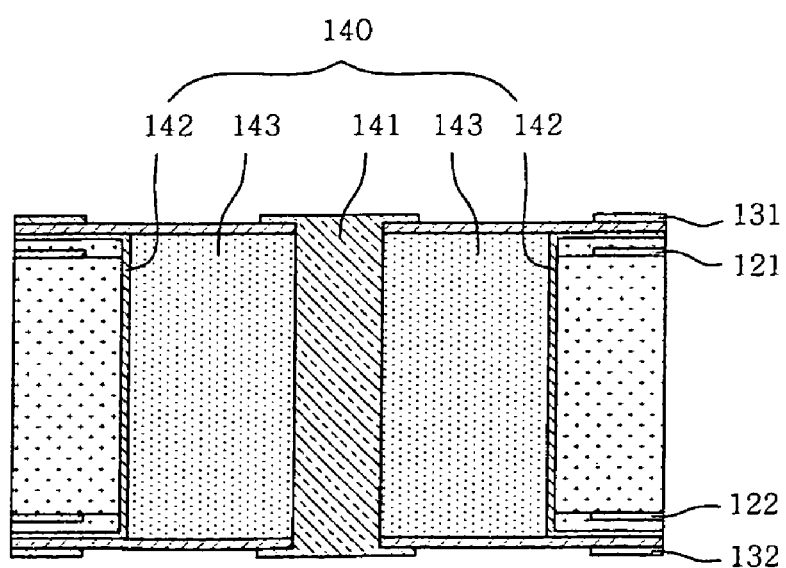
FIG. 2a is a sectional view of a PCB according to the first embodiment of the present invention, which has a coaxial via hole including one inner via hole for signal transfer.
Figure 2B:
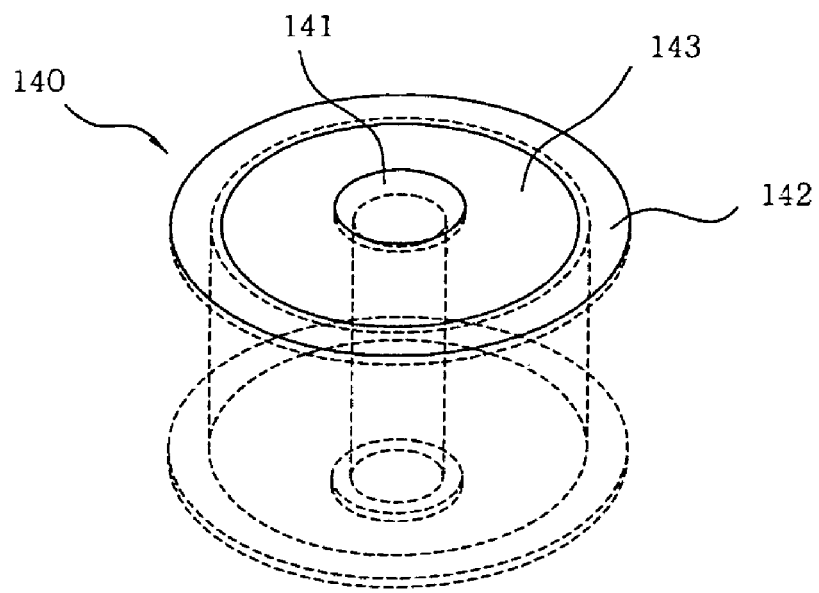
FIG. 2b illustrates the coaxial via hole, which includes the one inner via hole, according to the first embodiment of the present invention.

FIG. 2a is a sectional view of a PCB according to the first embodiment of the present invention, which has a coaxial via hole 140 including one inner via hole 141 for signal transfer, and FIG. 2b illustrates the coaxial via hole 140, which includes the one inner via hole 141, according to the first embodiment of the present invention.

As shown in FIGS. 2a and 2b, the PCB having the coaxial via hole 140 according to the present invention includes the one inner via hole 141 and an outer ground via hole 142. The inner via hole 141 transfers a signal between external layers 131, 132, on which circuit patterns are formed, therethrough. The outer ground via hole 142 has a circular section surrounding the inner via hole 141, and extends from an internal layer of the PCB to the other internal layer so as to be coaxial to the inner via hole 141 while the outer ground via hole is separated from a wall of the inner via hole by a predetermined distance.

It is preferable that the outer ground via hole 142 be made of a conductive material, such as Cu, and that an insulating material 143 be packed between the two holes so as to prevent the outer ground via hole 142 from being shorted by the inner via hole 141. Therefore, the outer ground via hole 142 and the inner via hole 141 can independently transfer signals therethrough.

The outer ground via hole 142 is grounded so as to block noise caused by the inner via hole 141. Furthermore, since the outer ground via hole 142 uniformly surrounds the inner via hole 141, it is possible to achieve impedance matching between the inner via hole 141 and a circuit pattern or a device. Accordingly, the PCB according to the present invention employs impedance matching between the inner via hole 141 and the circuit pattern or device to minimize reflection noise caused by conventional via holes.

As shown in FIG. 2a, when power supply layers or signal transfer layers 121, 122 are provided adjacent to the coaxial via hole 140 of the present invention, noise caused by the inner via hole 141 is blocked by the outer ground via hole 142, and thus does not affect the power supply layers or signal transfer layers 121, 122. In this case, the inner via hole 141, the outer ground via hole 142, and the power supply or signal transfer layers 121, 122 can independently transfer signals therethrough.

In a method of fabricating the PCB according to the first embodiment of the present invention, the outer ground via hole 142 having a predetermined diameter is formed through the PCB, in which the circuit pattern is formed on the internal layer thereof. Subsequently, electroless and electrolytic copper plating processes are conducted to copper-plate the outer ground via hole 142. Next, the insulating material 143 is packed in the outer ground via hole 142, and the inner via hole 142 for signal transfer is then formed using a drill. A copper plating process is implemented and circuit patterns are then formed on the external layers, thereby creating the PCB having the coaxial via hole 140 of the present invention as shown in FIG. 2a. At this stage, it is preferable that the outer ground via hole 142 be coaxial or axially parallel to the inner via hole 141.

In the method according to the first embodiment, the outer ground via hole 142 of the PCB having the coaxial via hole 140 is designed so that it is of a cylindrical shape having a predetermined diameter. However, the outer ground via hole may be fabricated in various shapes according to the purpose and application.

Figure 3A:
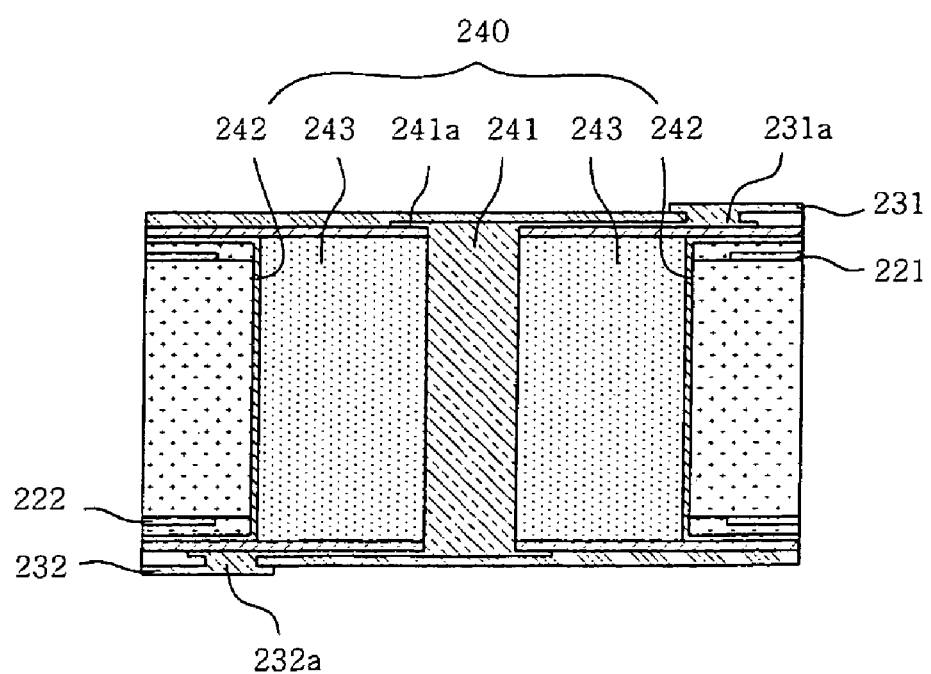
FIG. 3a is a sectional view of a PCB according to the second embodiment of the present invention, in which external layers are connected through blind via holes to internal layers and the internal layers are connected to a coaxial via hole.
Figure 3B:
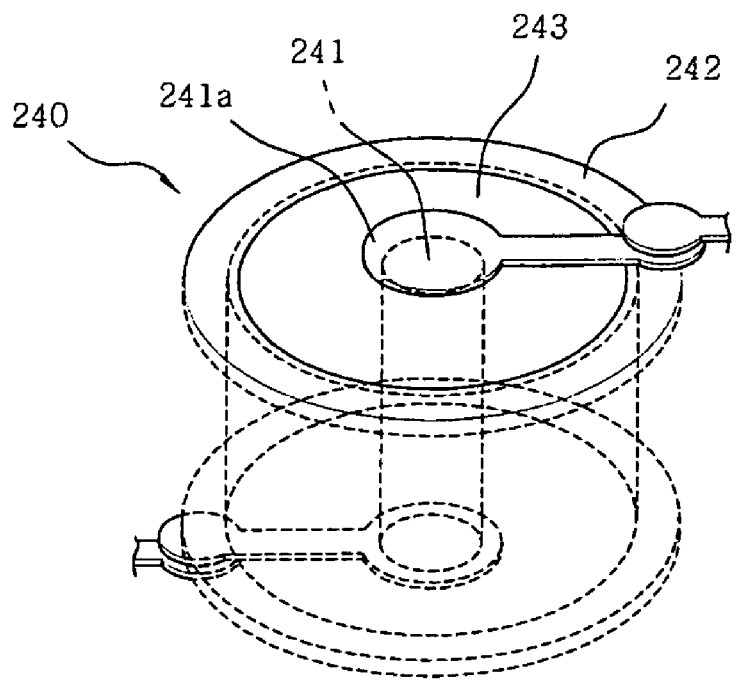
FIG. 3b illustrates the coaxial via hole, which is connected to the internal layers connected through the blind via holes to the external layers, according to the second embodiment of the present invention.

FIG. 3a is a sectional view of a PCB according to the second embodiment of the present invention, in which external layers 231, 232 are connected through blind via holes 231a, 232a to internal layers and the internal layers are connected to a coaxial via hole 240, and FIG. 3b illustrates the coaxial via hole 240, which is connected to the internal layers connected through the blind via holes 231a, 232a to the external layers 231, 232, according to the second embodiment of the present invention.

As shown in FIGS. 3a and 3b, in the PCB having the coaxial via hole 240 according to the present invention, the external layers 231, 232 are connected through the blind via holes 231a, 232a to the internal layers, and circuit patterns of the internal layers are connected to the internal layer coaxial via hole 240. The blind via holes 231a, 232a are spaced from the internal layer coaxial via hole 240 by a predetermined distance.

Preferably, lands 241a are formed at both ends of an inner via hole 241 to connect the blind via holes 231a, 232a to circuits. An outer ground via hole 242 is made of a conductive material, such as Cu, and an insulating material 243 is packed between the two holes so as to prevent the outer ground via hole 242 from being shorted by the inner via hole 241. Therefore, the outer ground via hole 242 and the inner via hole 241 can independently transfer signals therethrough.

As in the first embodiment as described above, the outer ground via hole 242 according to the second embodiment of FIGS. 3a and 3b is grounded so as to block noise caused by the inner via hole 241. Furthermore, since the outer ground via hole 242 uniformly surrounds the inner via hole 241, it is possible to achieve impedance matching between the staggered inner via hole 241 and a circuit pattern or a device. Accordingly, the PCB according to the present invention employs impedance matching between the inner via hole 241 and the circuit pattern or device to minimize reflection noise caused by conventional via holes.

As shown in FIG. 3a, when power supply layers or signal transfer layers 221, 222 are provided adjacent to the coaxial via hole 240 of the present invention, noise caused by the inner via hole 241 is blocked by the outer ground via hole 242, and thus does not affect the power supply layers or signal transfer layers 221, 222. In this case, the staggered inner via hole 241, the outer ground via hole 242, and the power supply layers or signal transfer layers 221, 222 can independently transfer signals therethrough.

At this stage, it may be considered that noise, which is caused by the blind via holes 231a, 232a of the external layers 231, 232 of the PCB, affects the circuit pattern or device. However, since the intensity of noise is very low, it is insignificant.

In FIGS. 3a and 3b, the outer ground via hole 242 of the PCB is designed so that it is of a cylindrical shape having a predetermined diameter. However, the outer ground via hole may be fabricated in various shapes according to the purpose and application. Additionally, it is preferable that the outer ground via hole 242 be coaxial or axially parallel to the inner via hole 241.

Figure 4A:
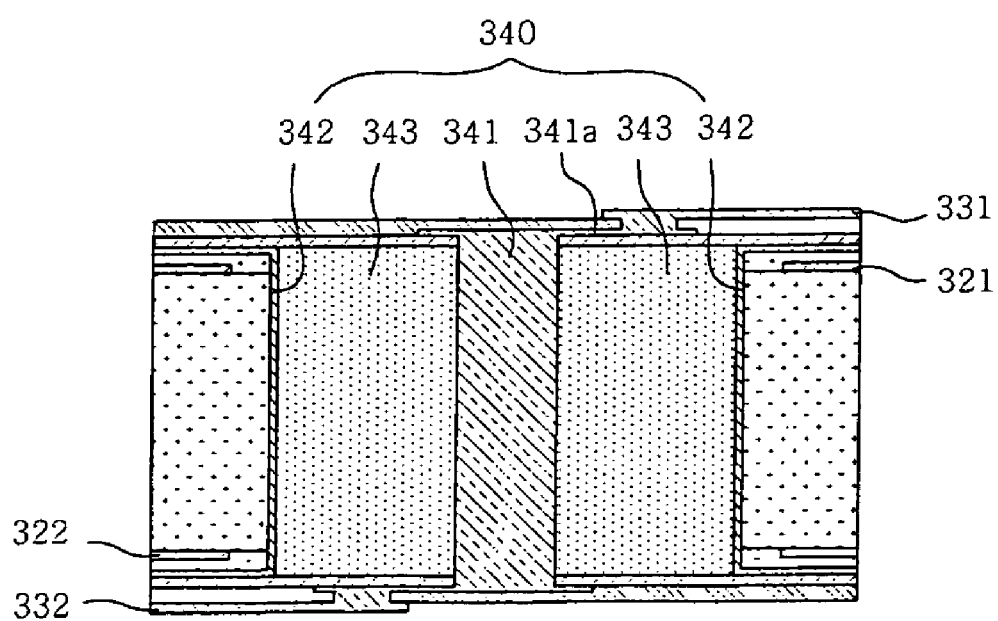
FIG. 4a is a sectional view of a PCB according to the third embodiment of the present invention, which has a coaxial via hole including one staggered inner via hole.
Figure 4B:
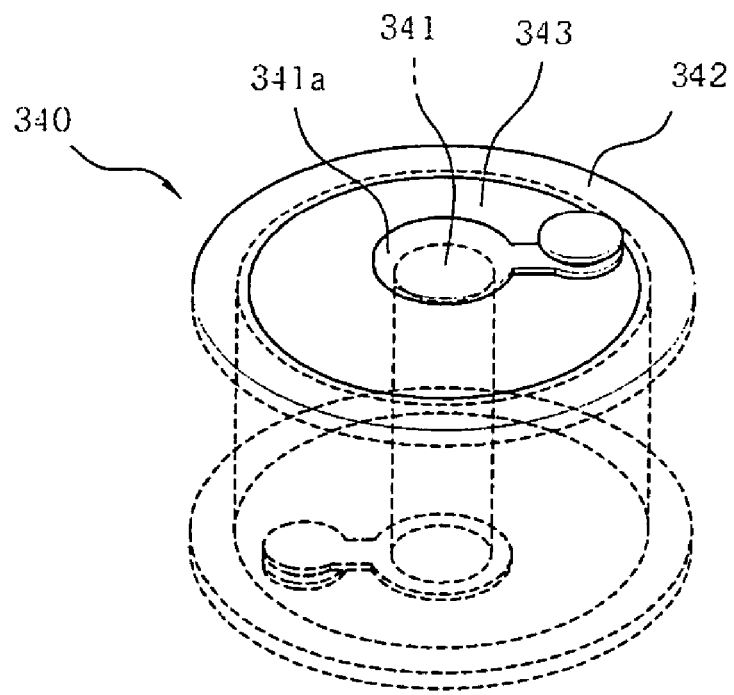
FIG. 4b illustrates the coaxial via hole, which includes the one staggered inner via hole, according to the third embodiment of the present invention.

FIG. 4a is a sectional view of a PCB according to the third embodiment of the present invention, which has a coaxial via hole 340 including one staggered inner via hole 341, and FIG. 4b illustrates the coaxial via hole 340, which includes the one staggered inner via hole 341, according to the third embodiment of the present invention.

As shown in FIGS. 4a and 4b, the PCB having the coaxial via hole 340 according to the present invention includes the one staggered inner via hole 341 and an outer ground via hole 342. Signals are transferred from the staggered inner via hole 341 through blind via holes 331a, 332a and lands 341a to external layers 331, 332. The outer ground via hole 342 has a circular section surrounding the staggered inner via hole 341, and extends from an internal layer of the PCB to the other internal layer so as to be coaxial to the staggered inner via hole 341 while the outer ground via hole is separated from a wall of the inner via hole by a predetermined distance.

At this stage, it is preferable that the outer ground via hole 342 be made of a conductive material, such as Cu, and that an insulating material 343 be packed between the two holes so as to prevent the outer ground via hole 342 from being shorted by the staggered inner via hole 341. Therefore, the outer ground via hole 342 and the inner via hole 341 can independently transfer signals therethrough.

If the PCB having the coaxial via hole 340 of FIGS. 4a and 4b is compared to the PCB having the coaxial via hole 240 of FIGS. 3a and 3b, they are different from each other in that signals are transferred to the blind via holes 331a, 332a of the external layers 331, 332 through the lands 341a of the staggered inner via hole 341 instead of the circuit pattern of the internal layer in the PCB of FIGS. 4a and 4b.

Figure 5A:
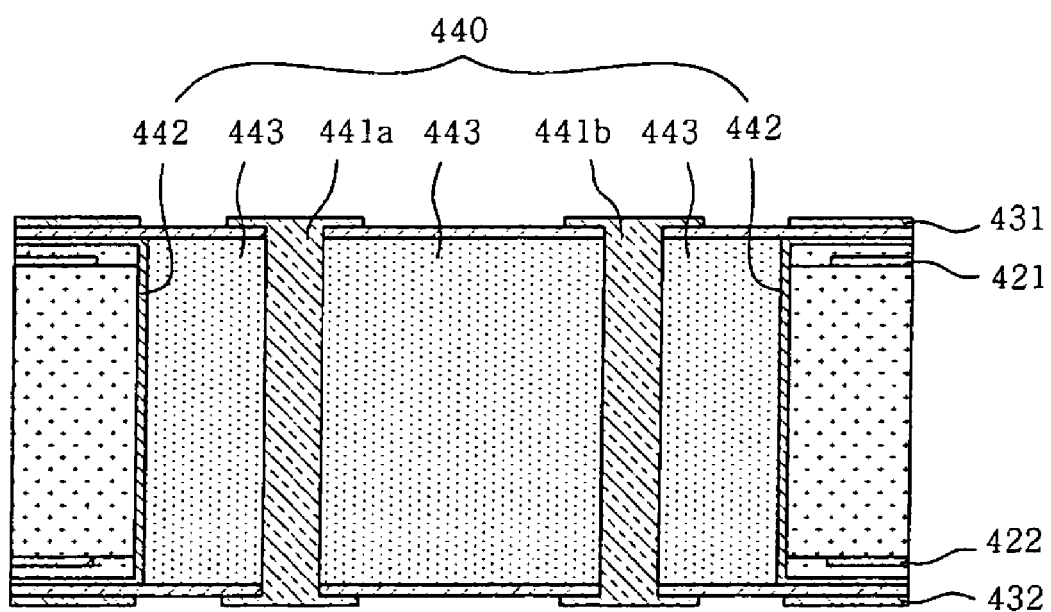
FIG. 5a is a sectional view of a PCB according to the fourth embodiment of the present invention, which has an outer ground via hole surrounding two inner via holes.
Figure 5B:
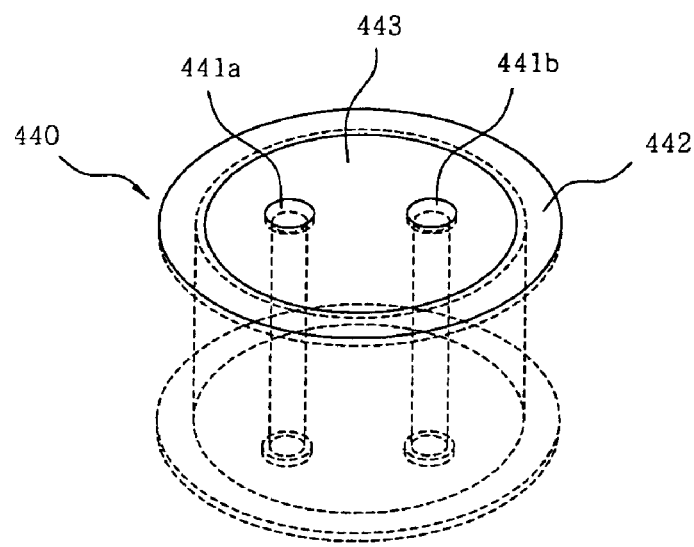
FIG. 5b illustrates the outer ground via hole, which surrounds the two inner via holes, according to the fourth embodiment of the present invention.

FIG. 5a is a sectional view of a PCB according to the fourth embodiment of the present invention, which has an outer ground via hole surrounding two inner via holes 441a, 441b, and FIG. 5b illustrates the outer ground via hole, which surrounds the two inner via holes 441a, 441b, according to the fourth embodiment of the present invention.

As shown in FIGS. 5a and 5b, the PCB having axially parallel via holes according to the present invention includes the two inner via holes 441a, 441b and an outer ground via hole 442. The two inner via holes 441a, 441b transfer signals between external layers 431, 432, on which circuit patterns are formed, therethrough. The outer ground via hole 442 has a circular section surrounding the two inner via holes 441a, 441b, and extends from the external layer 431 of the PCB to the other external layer 432 so as to be axially parallel to the two inner via holes 441a, 441b while the outer ground via hole is separated from walls of the inner via holes by a predetermined distance. At this stage, it is preferable that the outer ground via hole 442 be made of a conductive material, such as Cu, and that an insulating material 443 be packed between the two holes so as to prevent the outer ground via hole 442 from being shorted with the two inner via holes 441a, 441b. Therefore, the outer ground via hole 442 and the two inner via holes 441a, 441b can independently transfer signals therethrough.

If the PCB having axially parallel via holes of FIGS. 5a and 5b is compared to the PCB having the coaxial via hole 140 of FIGS. 2a and 2b, they are different from each other in that the two inner via holes 441a, 441b are formed in the outer ground via hole 442 in the PCB of FIGS. 5a and 5b. However, the PCB of FIGS. 5a and 5b is advantageous in that since the two inner via holes 441a, 441b for signal transfer are formed, it is possible to transfer a differential signal instead of two separate signals.

Figure 6A:
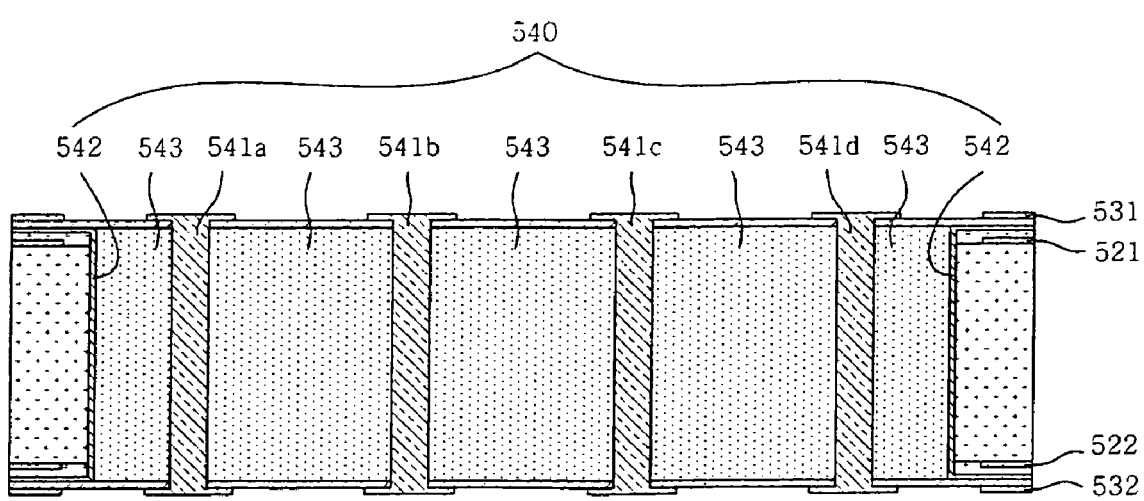
FIG. 6a is a sectional view of a PCB according to the fifth embodiment of the present invention, which has an outer ground via hole surrounding four inner via holes.
Figure 6B:
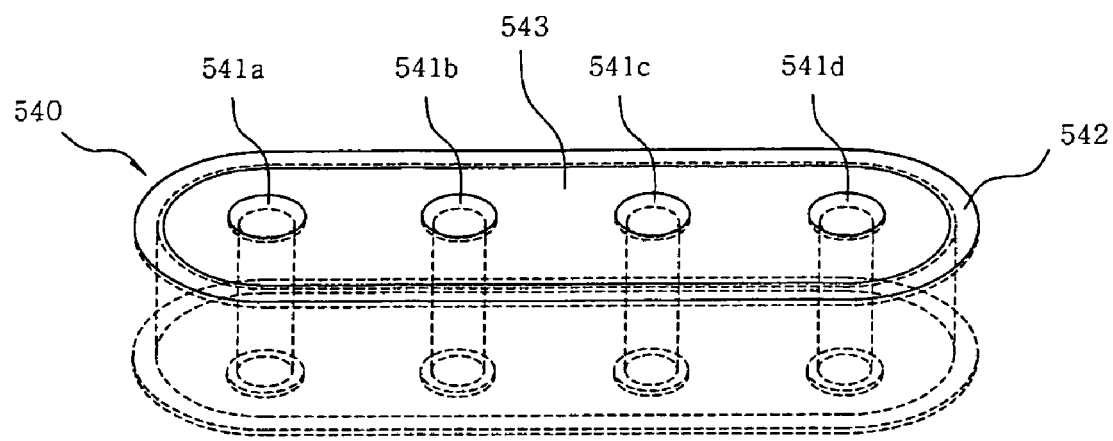
FIG. 6b illustrates the outer ground via hole, which surrounds the four inner via holes, according to the fifth embodiment of the present invention.
Figure 7:
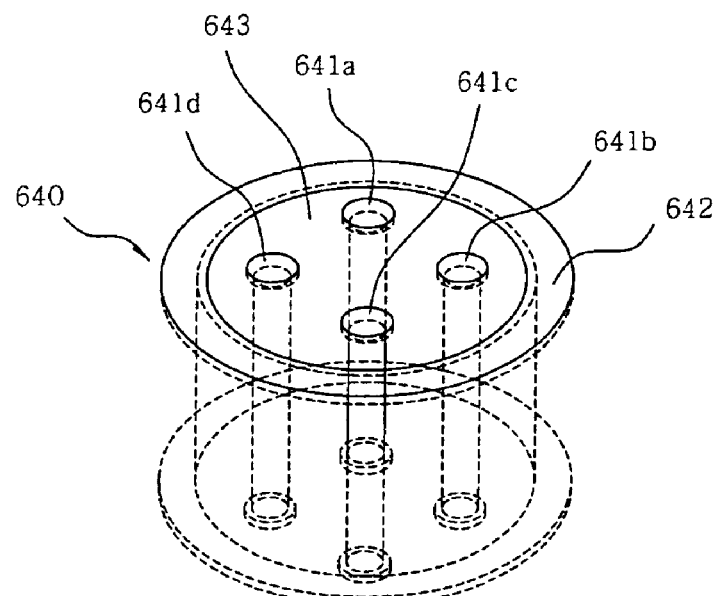
FIG. 7 illustrates an outer ground via hole, which surrounds four inner via holes, according to the sixth embodiment of the present invention.

FIG. 6a is a sectional view of a PCB according to the fifth embodiment of the present invention, which has an outer ground via hole surrounding four inner via holes 541a, 541b, 541c, 541d, FIG. 6b illustrates the outer ground via hole, which surrounds the four inner via holes 541a, 541b, 541c, 541d, according to the fifth embodiment of the present invention, and FIG. 7 illustrates an outer ground via hole, which surrounds four inner via holes 641a, 641b, 641c, 641d, according to the sixth embodiment of the present invention.

As shown in FIGS. 6a and 6b, the PCB having the axially parallel via holes according to the present invention includes the four inner via holes 541a, 541b, 541c, 541d and an outer ground via hole 542. The four inner via holes 541a, 541b, 541c, 541d transfer signals between external layers 531, 532, on which circuit patterns are formed, therethrough. The outer ground via hole 542 has an oval section surrounding the four inner via holes 541a, 541b, 541c, 541d and extends from the external layer 531 of the PCB to the other external layer 532 so as to be axially parallel to the four inner via holes 541a, 541b, 541c, 541d while the outer ground via hole is separated from walls of the inner via holes by a predetermined distance. At this stage, it is preferable that the outer ground via hole 542 be made of a conductive material, such as Cu, and that an insulating material 543 be packed between the two holes so as to prevent the outer ground via hole 542 from being shorted with the four inner via holes 541a, 541b, 541c, 541d. Therefore, the outer ground via hole 542 and the four inner via holes 541a, 541b, 541c, 541d can independently transfer signals therethrough.

If the PCB having the axially parallel via holes of FIGS. 6a and 6b is compared to the PCB having the axially parallel via holes of FIGS. 5a and 5b, since the four inner via holes 541a, 541b, 541c, and 541d are formed in the outer ground via hole 542, it is possible to transfer various types of signal, such as four separate signals, two pairs of differential signals, and a combination of two separate signals and one pair of differential signals.

As show in FIGS. 6b and 7, the outer ground via holes 542, 642 according to the present invention have oval and circular sections, but the sections of the outer ground via holes may have various shapes, such as a polygon, according to the purpose, application or design.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

As described above, the present invention provide a PCB having axially parallel via holes, in which an outer ground via hole, acting as a ground, is formed around a via hole of the PCB, thereby minimizing the effect of noise caused by the via hole due to high-speed signal switching.

Therefore, the PCB having the axially parallel via holes according to the present invention is advantageous in that since it is possible to achieve impedance matching between an inner via hole and a circuit pattern or a device, electric performance of the PCB is improved.

Another advantage of the PCB having the axially parallel via holes according to the present invention is that since transmission of transfer noise, which is caused by the inner via hole, to a power supply layer is blocked by the outer ground via hole, stability of a power supply of the PCB is improved.

Still another advantage of the PCB having the axially parallel via holes according to the present invention is that since interaction between via holes for transferring high-speed signals is blocked by the outer ground via hole, integration of the via holes is improved.

What is claimed is:

1. A printed circuit board having axially parallel via holes, comprising:
    a plurality of circuit layers, on which circuit patterns are formed;
    a plurality of insulating layers interposed between the plurality of circuit layers, thereby forming internal and external circuit layers;
    a plurality of via holes having a continuous curvilinear section, which extends perpendicular to a surface of any one of the plurality of circuit layers and which is plated with a first conductive material on walls thereof;
    an outer ground via hole having a continuous curvilinear section surrounding at least two via holes of the plurality of via holes, which extends transverse to and for a distance equal to the thickness of at least three insulating layers having internal circuit layers disposed therebetween, the outer ground via hole extending in an axial direction of the via hole surrounded thereby while being separated from a wall of the via hole by a predetermined distance and which is plated with a second conductive material on the wall thereof;
    an insulating material packed between the via hole, which is surrounded by the outer ground via hole, and the outer ground via hole; and
    wherein the via hole, which is surrounded by the outer ground via hole, is selected from the group consisting of:
        an inner via hole electrically connecting at least two internal circuit layers;
        a staggered via hole having a step-shaped path and electrically connecting at least two circuit layers;
        a stacked via hole having an straight-shaped path and electrically connecting at least two circuit layers;
        a through via hole electrically connecting the external circuit layers; and
        a blind via hole electrically connecting at least two circuit layers, wherein the blind via hole does not pass completely through the printed circuit board.

2. The printed circuit board as set forth in claim 1, wherein the outer ground via hole is grounded.

3. The printed circuit board as set forth in claim 1, wherein the second conductive material of the outer ground via hole is a copper plating layer.

4. The printed circuit board as set forth in claim 1, wherein the via hole, which is surrounded by the outer ground via hole, is coaxial to the outer ground via hole.

5. The printed circuit board as set forth in claim 1, wherein the via hole, which is surrounded by the outer ground via hole, is axially parallel to the outer ground via hole.

6. A printed circuit board having axially parallel via holes, comprising:
    a plurality of circuit layers, on which circuit patterns are formed;
    a plurality of insulating layers interposed between the plurality of circuit layers, thereby forming internal and external circuit layers;
    a plurality of via holes having a continuous curvilinear section, which extends perpendicular to a surface of any one of the plurality of circuit layers and which is plated with a first conductive material on walls thereof;
    an outer ground via hole having a continuous curvilinear section surrounding at least two via holes of the plurality of via holes, which extends transverse to and for a distance equal to the thickness of at least three insulating layers having internal circuit layers disposed therebetween, the outer ground via hole extending in an axial direction of the via hole surrounded thereby while being separated from a wall of the via hole by a predetermined distance and which is plated with a second conductive material on the wall thereof;
    an insulating material packed between the via hole, which is surrounded by the outer ground via hole, and the outer ground via hole; and
    wherein the via hole, which is surrounded by the outer ground via hole, is selected from the group consisting of:
        an inner via hole electrically connecting at least two internal circuit layers;
        a staggered via hole having a step-shaped path and electrically connecting at least two circuit layers;
        a stacked via hole having an straight-shaped path and electrically connecting at least one internal and at least one external circuit layers;
        a blind via hole electrically connecting at least two circuit layers, wherein the blind via hole does not pass completely through the printed circuit board.

7. A printed circuit board having axially parallel via holes, comprising:
    a plurality of circuit layers, on which circuit patterns are formed;
    a plurality of insulating layers interposed between the plurality of circuit layers, thereby forming internal and external circuit layers;
    a plurality of via holes having a continuous curvilinear section, which extends perpendicular to a surface of any one of the plurality of circuit layers and which is plated with a first conductive material on walls thereof;
    an outer ground via hole surrounding at least one via hole of the plurality of via holes, which extends transverse to and for a distance equal to the thickness of at least three insulating layers having internal circuit layers disposed therebetween, the outer ground via hole extending in an axial direction of the via hole surrounded thereby while being separated from a wall of the via hole by a predetermined distance and which is plated with a second conductive material on the wall thereof; and
    an insulating material packed between the via hole, which is surrounded by the outer ground via hole, and the outer ground via hole.

* * * * *